United States Patent [19]

Bowman et al.

[11] Patent Number: 5,872,403
[45] Date of Patent: Feb. 16, 1999

[54] PACKAGE FOR A POWER SEMICONDUCTOR DIE AND POWER SUPPLY EMPLOYING THE SAME

[75] Inventors: Wayne C. Bowman, Allen; Shiaw-Jong Stee Chen, Plano, both of Tex.

[73] Assignee: Lucent Technologies, Inc., Murray Hill, N.J.

[21] Appl. No.: 778,122

[22] Filed: Jan. 2, 1997

[51] Int. Cl.⁶ ............................. H01L 23/02; H02M 7/521
[52] U.S. Cl. .......................... 257/780; 257/782; 257/692; 257/693; 257/698; 174/52.4
[58] Field of Search ...................... 257/723, 700, 257/666, 707, 692, 693, 712, 698, 581, 584, 780, 782; 174/260, 52.4, 252; 363/147

[56] References Cited

U.S. PATENT DOCUMENTS

| | | | |
|---|---|---|---|
| 3,969,752 | 7/1976 | Martin et al. | 257/584 |
| 4,622,627 | 11/1986 | Rodriguez et al. | 363/37 |
| 4,766,479 | 8/1988 | Krum et al. | 257/737 |
| 4,998,160 | 3/1991 | Dunn | 257/502 |
| 5,043,859 | 8/1991 | Korman et al. | 363/147 |
| 5,075,759 | 12/1991 | Moline | 357/70 |
| 5,250,843 | 10/1993 | Eichelberger | 257/692 |
| 5,532,512 | 7/1996 | Fillion et al. | 257/685 |
| 5,559,374 | 9/1996 | Ohta et al. | 257/723 |
| 5,659,462 | 8/1997 | Chen et al. | 363/21 |
| 5,703,399 | 12/1997 | Majumdar et al. | 257/723 |
| 5,705,848 | 1/1998 | Bayerer | 257/723 |
| 5,739,578 | 4/1998 | Goto | 257/584 |

OTHER PUBLICATIONS

Disclosure entitled: "Interleaved Forward Converter Using Zero–Voltage Resonant Transition Switching for Distributed Power Processing" Authors: c.P. Henze, D.S. Lo and J.H. Mulkern of Unisys Corporation; pp. 1–18.

Disclosure entitled: "High–Frequency Forward ZVS–MRC For a Low–Profile High–Density On–Board Power Supply" Authors: Wojciech A. Tabisz, Richard T. Gean and Fred C. Lee; pp. 21–30.

Primary Examiner—Tom Thomas
Assistant Examiner—Alexander Oscar Williams

[57] ABSTRACT

A method of mounting a power semiconductor die on a substrate, a package for the die and a power supply including the package. The die has a first power terminal on a first surface thereof and a second power terminal on an opposing second surface thereof. The method including the steps of: (1) forming an electrically-conductive, mechanical bond between the first surface and a first location on the substrate, the mechanical bond electrically coupling the first power terminal to the substrate and (2) soldering an elongated electrically conductive strap to the second surface and a second location on the substrate, the conductive strap composed of a material having an electrical resistivity at most about $5.0 \times 10^{-8}$ ohm-meters ($\Omega$-m) and forming a low impedance path between the second power terminal and the second location.

15 Claims, 3 Drawing Sheets

PACKAGE FOR A POWER SEMICONDUCTOR DIE AND POWER SUPPLY EMPLOYING THE SAME

TECHNICAL FIELD OF THE INVENTION

The present invention is directed, in general, to power electronics and, more specifically, to a low impedance, heavy current conductor for a power device and method of manufacture therefor.

BACKGROUND OF THE INVENTION

Electronic devices for the power supplies or other applications are conventionally provided in a protective, heat-dissipating package. Often, the device (e.g., a metal oxide semiconductor field-effect transistor, or "MOSFET") is attached to a lead-frame and connected to external leads by a wire bonding technique. The device is then encapsulated or "molded," wherein an encapsulant is formed about the device to yield a unitary, board-mountable package. One well-known configuration for board-mountable package is a so-called dual in-line package ("DIP"), wherein electrical leads protrude from opposing sidewalls of the package. The leads are advantageously so arranged to allow the package to be mounted to a circuit board by various conventional soldering processes. DIPs are widely used for packaging integrated circuits, most often in telecommunications or computer-related environments.

In a power electronics environment, the packaged power devices are conventionally mounted directly to a printed wiring board or substrate, using either through-hole or surface-mounting techniques. The devices are then joined with other electronic components to form a circuit, perhaps to function as a modular power supply.

The power dissipation of the power devices is based on the electrical current passing through the devices and the electrical resistances therein. The electrical resistances generally include the internal electrical resistance of the device (e.g., $R_{DS(on)}$ of the MOSFET), the electrical resistance caused by interconnections within the encapsulated package (e.g., wire bonds) and electrical resistance caused by interconnections between the encapsulated package and the copper traces of the substrate. Depending on, for instance, the diameter of the bonding wire, the interconnection electrical resistance within the package may be several milliohms ("mΩ") to several tens of mΩ. Of course, reducing the electrical resistances is a continuing objective to reduce the overall power dissipation of the device. In conjunction therewith, reducing the interconnection electrical resistance within the power device is more important as a result of the advancement in the design of the power devices. As compared to the internal electrical resistance of the conventional power devices, the newer generation power devices have discernibly lower internal electrical resistances (e.g., a $R_{DS(on)}$ in the range of 4 to 20 mΩ) making the electrical resistances caused by the interconnections within the power device more critical.

In addition to the internal resistance concerns associated with the interconnections within the power device, there are physical considerations as well. As previously mentioned, new generation power devices, such as a Gallian Arsenide ("GaAs") power device, are exhibiting improved characteristics over the more conventional Silicon ("Si") based power devices. GaAs power devices are exhibiting advantages such as faster switching speeds and lower switching capacitances and losses. However, the new generation of power devices are structurally thinner (e.g., a thickness of 4 to 6 mils) and more brittle than the conventional Silicon-based devices. Thus, the previous methods of wire bonding including the use of heavy wires is not optimal with power devices, especially the new generation power devices.

As with other types of electronic components, the trend in the design of power supply module has been toward achieving increased power and device density and lower module profile. However, any improvements in power, density and profile cannot be at the expense of the thermal and electrical characteristics of the components and overall power supply.

One way to achieve higher power density without sacrificing thermal and electrical characteristics is to reduce the electrical and thermal resistances of the power device. A conventional technique to reduce the electrical and thermal resistances is to mount the bare die of the power devices directly to the substrate. The bare die is typically wire-bonded to the substrate; the bare device is then locally encapsulated in a process generally referred to as "glob-top." While this direct wire-bonding technique does reduce the profile of the power device on the substrate of the power module, it fails to reduce the electrical resistance of the device adequately, because the heavy wire bonds are still required to complete the electrical connections.

Accordingly, what is needed in the art is a technique for attaching an unpackaged power device, such as a MOSFET, to a substrate such that the interconnection resistance is reduced, the power and device density are increased and the module profile is decreased without sacrificing the thermal and electrical characteristics of the device. This technique should also facilitate the attachment of new generation power devices, such as the GaAs based power devices, to the substrate. Preferably, the technique should be cost-effective and suitable for mass production.

SUMMARY OF THE INVENTION

To address the above-discussed deficiencies of the prior art, the present invention provides a method of mounting a power semiconductor die ("die") on a substrate, a package for the die and a power supply including the package. The die has a first power terminal on a first surface thereof and a second power terminal on an opposing second surface thereof. The method including the steps of: (1) forming an electrically-conductive, mechanical bond between the first surface and a first location on the substrate, the mechanical bond electrically coupling the first power terminal to the substrate and (2) soldering an elongated electrically conductive strap to the second surface and a second location on the substrate, the conductive strap composed of a material having an electrical resistivity at most about $5.0 \times 10^{-8}$ ohm-meters ("Ω-m") and forming a low impedance path between the second power terminal and the second location.

The present invention therefore eliminates the need for wire bonds to the power terminals of the die. This, in turn, relieves the mechanical stress and expense of such bonds. In lieu of the bonds, the present invention provides a direct substrate coupling for one of the power terminals and a low impedance, elongated conductive strap for the other power terminal. The conductive strap is preferably composed of a good conductive material, such as copper, and is sized to handle the electrical current that is to pass through the die during its operation. For instance, a strap capable of handling 20 amperes of current should provide less than 0.4 mΩ of resistance and 0.6 nanohenrys ("nH") of inductance.

In one embodiment of the present invention, the method further comprises the step of electrically coupling a control terminal to a third location on the substrate. Alternatively, the die can be inverted, allowing the second power terminal and the control terminal to be directly mounted to the substrate and the first power terminal to be coupled to the substrate via the strap. Alternatively, the first and second power terminals may be located on one surface of the die; in such cases, the conductive strap is employed to couple both the first and second power terminals to the substrate. Those skilled in the art will understand that control terminals are not typically required to conduct as much electrical current as do the power terminals. Accordingly, the conductor coupling the control terminal to the substrate does not require the same structure as the conductive strap.

In one embodiment of the present invention, the method further comprises the step of surrounding the die, conductive strap and at least a portion of the substrate with an encapsulant. Of course, encapsulation is not necessary in all applications. In fact, some applications may benefit from leaving the package unencapsulated.

In one embodiment of the present invention, the material is selected from the group consisting of: (1) copper, (2) silver and (3) gold. Those skilled in the art are familiar with the properties of conductive materials and can readily see that other materials, including materials with relatively lower electrical conductive properties, may be suitable for the conductive strap.

In one embodiment of the present invention, the method further comprises the step of surrounding the material with an electrically conductive coating to form the conductive strap. In an embodiment to be described, the electrically conductive coating is particularly conducive to soldering operations, allowing the conductive strap to be soldered reliably to the second power terminal and the substrate. Of course, the material of the conductive strap need not be coated.

In one embodiment of the present invention, the step of forming comprises the step of soldering the first surface of the die to the first location of the substrate. In a manner to be described, soldering effects a sound, low impedance electrical connection between the first power terminal and the substrate. Those skilled in the art will recognize, however, that mechanical compression or other conventional techniques may alternatively be employed to advantage.

In one embodiment of the present invention, the power semiconductor die has a number of terminals selected from the group consisting of two, three and four. Power dies, such as, without limitation, a diode, metal-oxide semiconductor field effect transistor ("MOSFET"), Gallian Arsenide field-effect transistor ("GaAs FET"), bipolar transistor or insulated gate bipolar transistor ("IGBT") are well within the broad scope of the present invention.

In one embodiment of the present invention, the conductive strap comprises an arcuate section, a lateral bend and a substantially straight section, the lateral bend separating the arcuate section and the substantially straight section. In this illustrated embodiment, the conductive strap is provided with a bend. The bend allows the strap to flex, within limits, during operation of the die. The flexing reduces mechanical stress on the die. The conductive strap is also provided with a straight (or flat) section that is substantially parallel to the first surface of the die. The straight section accommodates an automatic pick and placement assembly process for mounting the strap. However, other configurations of the conductive strap that allow for flexibility and automatic assembly without sacrificing current-handling capacity are within the broad scope of the present invention.

The present invention also provides a power supply comprising a power train having a conversion stage including power switching devices for receiving input electrical power and producing therefrom switched electrical power. The power switching devices are formed as dies. Each of said dies have a first power terminal on a first surface thereof and a control terminal and a second power terminal on an opposing second surface thereof. At least one of the dies is contained within a semiconductor package conforming to the structure set forth above in its broadest form. The power supply further comprises a filter stage for filtering the switched electrical power to produce output electrical power. Of course, the package may be employed in applications other than power supplies.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

DETAILED DESCRIPTION

Figure 1A:
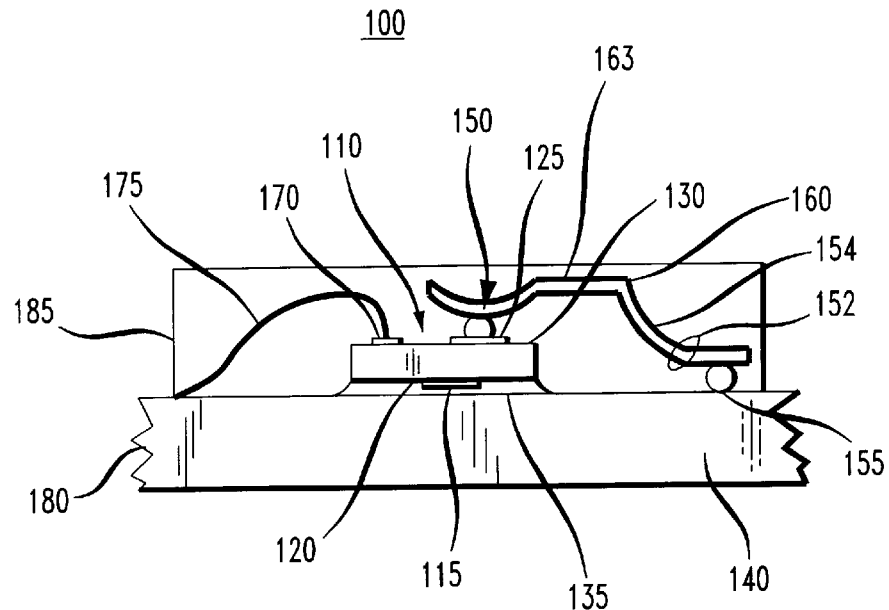
FIGS. 1A and 1B illustrate an embodiment of a package for a power semiconductor die constructed according to the principles of the present invention.
Figure 1B:
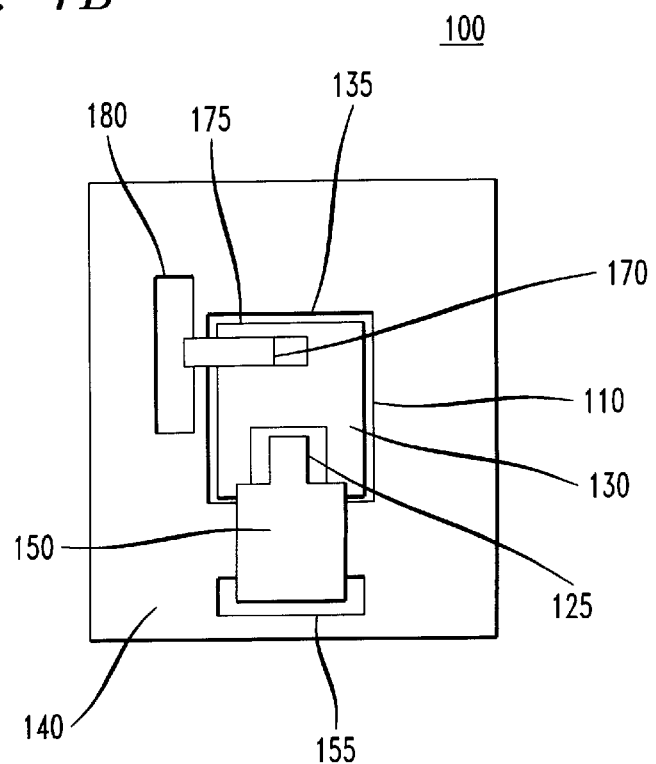

Referring initially to FIGS. 1A and 1B, illustrated is an embodiment of a package 100 for a power semiconductor die or die 110 constructed according to the principles of the present invention. FIG. 1A illustrates a side view of the package 100 and FIG. 1B illustrates a top view of the package 100. The power semiconductor die 110 has a first power terminal 115 on a first surface 120 of the die 110 and a second power terminal 125 on an opposing second surface 130 of the die 110. The package 100 includes an electrically-conductive, mechanical bond formed between the first surface 120 and a first location 135 on a substrate 140. The mechanical bond electrically couples the first power terminal 115 to the substrate 140. The package 100 also includes an elongated electrically conductive strap 150 that is soldered to the second power terminal 125 and a second location 155 on the substrate 140. The conductive strap 150 is composed of an electrically conductive material (e.g., 5 mil thick copper) and has a lateral bend 160 therein to compensate for thermal expansion of the conductive strap 150 during operation of the die 110. The lateral bend 160 of the conductive strap 150 separates an arcuate section 154 and a substantially straight (flat) section 163 at an approximately normal angle. The conductive strap 150 is coated with an electrically conductive coating 152 surrounding the material of the conductive strap 150. The power semiconductor die 110 further has a control terminal 170; a control conductor 175 electrically couples the control terminal 170 to a third location 180 on the substrate 140. The package 100 still further includes an encapsulant 185 surrounding the die 110, conductive strap 150 and at least a portion of the substrate 140.

The mechanical bonds are formed of solder to effect a sound, low impedance electrical connection between the electrical components. Of course, other bonding techniques are well within the broad scope of the present invention. While the power semiconductor die 110 with terminals (namely, the first terminal or drain connection 115, second terminal or source connection 125 and control terminal or gate connection 170) makes up a GaAs FET, other devices are well within the broad scope of the present invention. Furthermore, the substrate 140 is generally composed of ceramic material. Of course, other materials are within the broad scope of the present invention.

As previously mentioned, the conductive strap 150 is coated with an electrically conductive coating (e.g., solder plating) 152 and then formed into shape. The substantially straight section 163 facilitates machine pick and placement assembly. The section above the die 110 is bent upwards to avoid solder bridging with the area proximate the second power terminal (i.e., the source pad) 125. The section above the die 110 is further designed to be about the same width as the die 110 to minimize the electrical resistance thereabout. For instance, the electrical resistance of the conductive strap 150 (employing copper with a resistivity of $1.8 \times 10^{-8}$ $\Omega$-m), including the section above the die 110, is about 0.23 m$\Omega$Q.

Figure 2A:
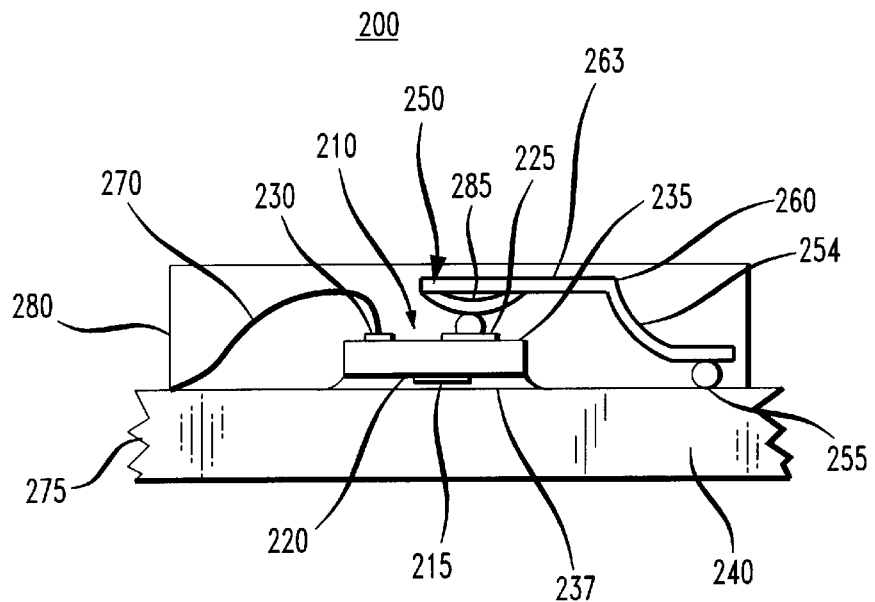
FIGS. 2A and 2B illustrate an alternative embodiment of a package for a power semiconductor die constructed according to the principles of the present invention.
Figure 2B:
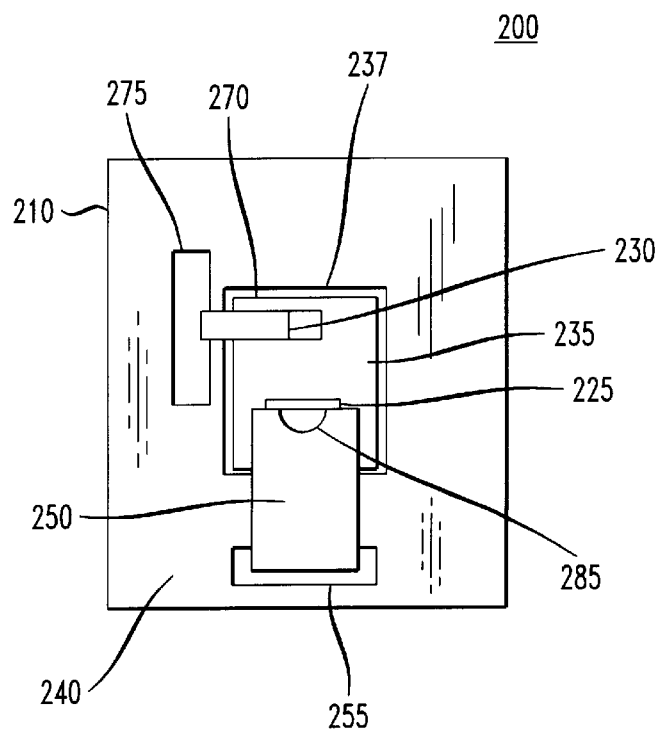

Turning now to FIGS. 2A and 2B, illustrated is an alternative embodiment of a package 200 for a power semiconductor die or die 210 constructed according to the principles of the present invention. FIG. 2A illustrates a side view of the package 200 and FIG. 1B illustrates a top view of the package 200. The package 200 for the power semiconductor die 210 is analogous to the package 100 for the power semiconductor die 110 of FIGS. 1A and 1B and includes the following components. The power semiconductor die 210 has a first power terminal 215 on a first surface 220 of the die 210, and a second power terminal 225 and control terminal 230 on an opposing second surface 235 of the die 210. The package 200 includes an electrically-conductive, mechanical bond formed between the first surface 220 and a first location 237 on a substrate 240. The mechanical bond electrically couples the first power terminal 215 to the substrate 240. The package 200 also includes an elongated electrically conductive strap 250 that is soldered to the second power terminal 225 and a second location 255 on the substrate 240. The conductive strap 250 is composed of an electrically conductive material (e.g., an alloy including about 58% Iron and 42% Nickel and having a resistivity of about $5.0 \times 10^{-8}$ $\Omega$-m) and has a lateral bend 260 therein to compensate for thermal expansion of the conductive strap 250 during operation of the die 210. The lateral bend 260 of the conductive strap 250 separates an arcuate section 254 and a substantially straight section 263 (having a dimple 285) at an approximately normal angle. A control conductor 270 electrically couples the control terminal 230 to a third location 275 on the substrate 240. The package 200 still further includes an encapsulant 280 surrounding the die 210, conductive strap 250 and at least a portion of the substrate 240.

The present invention, therefore, eliminates the need for wire bonds to the power terminals of the die. In lieu of the bonds, the present invention provides a direct substrate coupling for one of the power terminals and a low impedance, elongated electrically conductive strap for the other power terminal. As a result, the present invention provides several advantages. First, the direct coupling of the die to the substrate will reduce the substrate surface area required for the device. Second, the electrical resistance of the interconnection is reduced thereby simplifying the heat sinking requirements. Third, the conductive strap and assembly thereof does not place undue mechanical stress on the die of the device. This is especially important with GaAs devices whereby the dies are brittle and more susceptible to damage. Also, the present design is compatible with the present surface mount assembly technologies and the straight section accommodates an automatic pick and placement assembly process for mounting the strap.

Of course, those skilled in the art should understand that the above-described embodiments of the package for the power semiconductor die are presented for illustrative purposes only, and other embodiments, constructed according to the principles introduced herein, are well within the broad scope of the present invention.

Figure 3:
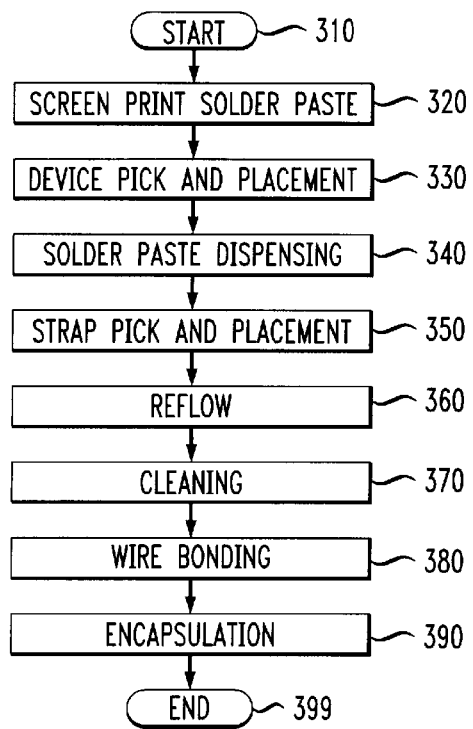
FIG. 3 illustrates a flow diagram of a method of mounting a power semiconductor die on a substrate in accordance with the principles of the present invention.

Turning now to FIG. 3, illustrated is a flow diagram of a method of mounting a power semiconductor die or die on a substrate in accordance with the principles of the present invention. The method commences at a start step 310. At a screen print and solder paste step 320, the substrate is screen printed and solder paste is placed thereon. The power semiconductor die is then placed on the substrate at a device pick and placement step 330. Solder paste is dispensed on the source pad on the top of the die at a solder paste dispensing step 340. At a strap pick and placement step 350, an elongated electrically conductive strap is machine placed between the top of the die and the substrate. The substrate with die coupled thereto then goes through a reflow process at a reflow step 360. The die and substrate then are cleaned (e.g., plasma cleaning) at a cleaning step 370. At a wire bonding step 380, a control terminal is wire bonded to the substrate thereby electrically coupling the control terminal to the substrate. Of course, if the control terminal is coupled to the substrate via a electrically conductive strap then the wire bond step 380 is unnecessary. The method proceeds with the step of surrounding the die, conductive strap and at least a portion of the substrate with an encapsulant at an encapsulation step 390. The method is completed at an end step 399.

For a better understanding of power electronic devices (including semiconductor devices) and the associated fabrication processes see *Power Semiconductor Devices*, by B. Jayant Baliga, North Carolina State University (1995). The aforementioned reference is herein incorporated by reference.

Figure 4:
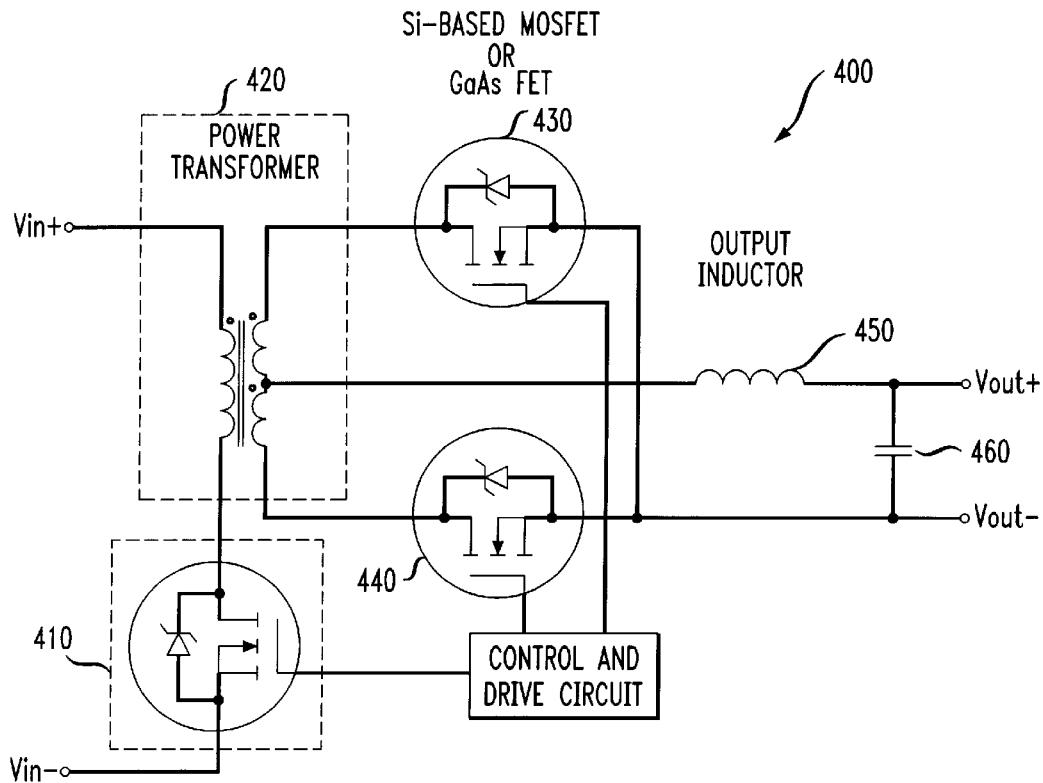
FIG. 4 illustrates a schematic diagram of an exemplary power supply employing a package in accordance with the principles of the present invention.

Turning now to FIG. 4, illustrated is a schematic diagram of an exemplary power supply 400 employing a package (for an illustration, see FIGS. 1 and 2) in accordance with the principles of the present invention. The power supply 400 includes a power train having a conversion stage including a power switching device 410 for receiving input electrical power $V_{IN}$ and producing therefrom switched electrical power. The power switching device 410 is formed of a die having a first power terminal, a control terminal and a second power terminal. The power supply 400 further includes a filter stage (including an output inductor 450 and output capacitor 460) for filtering the switched electrical power to produce output electrical power (represented as a voltage $V_{OUT}$). The power supply 400 still further includes a transformer 420 and a rectification stage (including rectifying FETs 430, 440) coupled between the power conversion stage and the filter stage. Each of the rectifying FETS is formed of a die having a first power terminal, a control terminal and a second power terminal. The dies are contained within a package constructed according to the principles of the present invention. Again, see FIGS. 1 and 2 for representative embodiments of the package.

For a better understanding of power electronics including power supplies and conversion technologies see *Principles of Power Electronics*, by J. G. Kassakian, M. F. Schlecht and G. C. Verghese, Addison-Wesley (1991). The aforementioned reference is herein incorporated by reference.

Although the present invention has been described in detail, those skilled in the art should understand that they can make various changes, substitutions and alterations herein without departing from the spirit and scope of the invention in its broadest form.

What is claimed is:

1. A package for a power semiconductor die, said die having a first power terminal on first surface thereof and a second power terminal on an opposing second surface thereof, said package comprising:

an electrically-conductive, mechanical bond formed between said first surface and a first location on a substrate, said mechanical bond electrically coupling said first power terminal to said substrate; and an elongated electrically conductive strap having an arcuate section soldered at a substantially tangential point on said arcuate section to said second surface and a second location on said substrate, said conductive strap composed of a material having an electrical resistivity at most about $5.0 \times 10^{-8}$ ohm-meters ($\Omega$-m) and forming a low impedance path between said second power terminal and said second location.

2. The method as recited in claim 1 wherein said power semiconductor die further has a control terminal, the method further comprising the step of electrically coupling said control terminal to a third location on said substrate.

3. The package as recited in claim 1 further comprising an encapsulant surrounding said die, conductive strap and at least a portion.

4. The package as recited in claim 1 wherein said material is selected from the group consisting of:

copper, silver, and gold.

5. The package as recited in claim 1 further comprising an electrically conductive coating surrounding said material to form said conductive strap.

6. The package as recited in claim 1 wherein said mechanical bond is formed of solder.

7. The package as recited in claim 1 wherein said power semiconductor die has a number of terminals selected from the group consisting of:

two, three, and four.

8. The package as recited in claim 1 wherein said substrate is selected from the group consisting of:

ceramic, and fiberensic.

9. The package as recited in claim 1 wherein said conductive strap comprises a lateral bend and a substantially straight section, said lateral bend separating said arcuate section and said substantially straight section.

10. A power supply, comprising:

a power train having a conversion stage including power switching devices for receiving input electrical power and producing therefrom switched electrical power, said power switching devices formed as dies, each of said dies having a first power terminal on a first surface thereof, and a control terminal and a second power terminal on an opposing second surface thereof, at least one of said dies contained within a package, comprising:

an electrically-conductive, mechanical solder bond formed between said first surface and a first location on a substrate, said mechanical bond electrically coupling said first power terminal to said substrate, an elongated electrically conductive strap having an arcuate section soldered at a substantially tangential point on said arcuate section to said second surface and a second location on said substrate, said conductive strap composed of a material having an electrical resistivity at most about $5.0 \times 10^{-8}$ ohm-meters ($\Omega$-m) and forming a low impedance path between said second power terminal and said second location, a control conductor electrically coupling said control terminal to a third location on said substrate, and an encapsulant surrounding said die, conductive strap and at least a portion of said substrate; and a filter stage for filtering said switched electrical power to produce output electrical power.

11. The power supply as recited in claim 10 wherein said material is selected from the group consisting of:

copper, silver, and gold.

12. The power supply as recited in claim 10 further comprising an electrically conductive coating surrounding said material to form said conductive strap.

13. The power supply as recited in claim 10 wherein said power semiconductor die is a Metal Oxide Semiconductor field-effect transistor (MOSFET).

14. The power supply as recited in claim 10 further comprising a rectification stage having power rectifying devices, said power rectifying devices formed as dies, each of said dies having a first power terminal on a first surface thereof and a second power terminal on an opposing second surface thereof, at least one of said dies contained within a package, comprising:

another electrically-conductive, mechanical solder bond formed between said first surface of said die and said substrate, said mechanical bond electrically coupling said first power terminal of said die to said substrate, and another elongated electrically conductive strap soldered to said second surface of said die and said substrate, said conductive strap composed of a material having an electrical resistivity at most about $5.0 \times 10^{-8}$ ohm-meters ($\Omega$-m) and forming a low impedance path between said second power terminal of said die and said substrate.

15. The power supply as recited in claim 10 wherein said conductive strap comprises a lateral bend and a substantially straight section, said lateral bend separating said arcuate section and said substantially straight section.

* * * * *

UNITED STATES PATENT AND TRADEMARK OFFICE
CERTIFICATE OF CORRECTION

PATENT NO. : 5,872,403
DATED : February 16, 1999
INVENTOR(S) : Wayne C. Bowman, et al.

It is certified that error appears in the above-identified patent and that said Letters Patent is hereby corrected as shown below:

On the title page, item[75]:

- Inventor's name:

"Shiaw-Jong Stee Chen" should be --Shiaw-Jong Steve Chen--.

Signed and Sealed this

Sixth Day of July, 1999

Attest:

Q. TODD DICKINSON

Attesting Officer

Acting Commissioner of Patents and Trademarks